(12) United States Patent
Theel

(10) Patent No.: US 6,775,195 B1
(45) Date of Patent: Aug. 10, 2004

(54) APPARATUS AND METHOD FOR ACCESSING A MAGNETORESISTIVE RANDOM ACCESS MEMORY ARRAY

(75) Inventor: Wayne Arthur Theel, Plymouth, MN (US)

(73) Assignee: Union Semiconductor Technology Center, Plymouth, MN (US)

( * ) Notice: Subject to any disclaimer, the term of this patent is extended or adjusted under 35 U.S.C. 154(b) by 0 days.

(21) Appl. No.: 10/377,530

(22) Filed: Feb. 28, 2003

(51) Int. Cl.[7] ................................................ G11C 7/02
(52) U.S. Cl. .................. 365/210; 365/158; 365/189.07
(58) Field of Search ................................ 365/210, 158, 365/189.07, 171, 207, 230.06, 194

(56) References Cited

U.S. PATENT DOCUMENTS

| 5,206,590 | A | 4/1993 | Dieny et al. |
| 5,699,293 | A | 12/1997 | Tehrani et al. |
| 6,134,138 | A | 10/2000 | Lu et al. |
| 6,385,111 | B2 * | 5/2002 | Tran et al. .................. 365/210 |
| 6,388,917 | B2 | 5/2002 | Hoffmann et al. |
| 6,473,336 | B1 | 10/2002 | Nakajima et al. |
| 6,515,896 | B1 | 2/2003 | Tran |
| 6,522,574 | B2 | 2/2003 | Li et al. |

FOREIGN PATENT DOCUMENTS

| US | 0018361 | 2/2002 |
| US | 0131296 | 9/2002 |
| US | 0159288 | 10/2002 |

* cited by examiner

Primary Examiner—David Lam
(74) Attorney, Agent, or Firm—Jones Day

(57) ABSTRACT

A magnetoresistive random access memory (MRAM) device includes a memory array having a plurality of bitlines and a plurality of wordlines intersecting the bitlines. A plurality of memory elements are located at the intersections of the wordlines and the bitlines and are operable to store data. A bitline selection circuit is operable to select a first bitline and to provide a first sense current to the first bitline to generate a first reference signal. A wordline selection circuit is operable to select wordlines and to provide wordline currents to a selected wordline after the first reference signal has stabilized and while the first sense current is applied to the first bitline.

49 Claims, 7 Drawing Sheets

APPARATUS AND METHOD FOR ACCESSING A MAGNETORESISTIVE RANDOM ACCESS MEMORY ARRAY

BACKGROUND

1. Technical Field

The invention relates in general to semiconductor devices, and more particularly to systems and methods for accessing a magnetoresistive random access memory (MRAM) array.

2. Description of the Related Art

An MRAM memory device typically comprises a memory array having a plurality of bitlines and a plurality of wordlines intersecting the bitlines. The intersection of each wordline and bitline may comprise a magnetic memory element, such as a pseudo-spin valve (PSV) cell that is operable to store data. A PSV cell typically comprises a hard layer (or storage layer) and a soft layer (or sense layer), both of which are magnetic materials. Each layer may be magnetically aligned by currents running through the wordline and the bitline. A data value of 0 may be written to a PSV cell when the hard layer is magnetized to a first polarization by the wordline and bitline currents, and a data value of 1 may be written to the PSV cell when the hard layer is magnetized to a second polarization by the wordline and bitline currents.

To read a PSV cell, the magnitudes of the wordline and bitline currents are reduced so that only the soft layer changes polarization. A sense current is applied to the bitline, and the soft layer is magnetically aligned to a first state by a first current applied to the wordline, and then oppositely aligned to a second state by a second current applied to the wordline. Depending on polarization of the hard layer, the resistance of the PSV cell will decrease or increase as the soft layer switches alignment from the first state to the second state.

Typically, the MRAM device has analog current sources to provide the sense currents, and sense amplifiers to generate bit signals corresponding to a 0 or a 1 data value stored in the hard layer. Upon energization, these circuits undergo transient responses. For example, a bitline may be modeled as a string of series connected resistors with an inherent line capacitance. Thus, a signal transient proportional to a first order response having a time constant $\tau = RC$ may be present. Other transients, such as transients associated with a current source applying the sense current to the bitline, may also be present. These transients may cause performance degradation and delays, thus increasing the time for memory access operations.

SUMMARY

An MRAM device includes a memory array having a plurality of bitlines and a plurality of wordlines intersecting the bitlines. A plurality of memory elements are located at the intersections of the wordlines and the bitlines and are operable to store data. A bitline selection circuit is operable to select a first bitline and to provide a first sense current to the first bitline to generate a first reference signal. A wordline selection circuit is operable to sequentially select wordlines and to provide wordline currents to a selected wordline after the first reference signal has stabilized and while the first sense current is applied to the first bitline.

In an MRAM device array comprising a plurality of bitlines and a plurality of wordlines, the wordlines intersecting the bitlines and each intersection of the wordlines and bitlines comprising a memory element, a method for reading the memory elements of a corresponding bitline includes the steps of applying a first sense current to a first bitline to generate a first reference signal, stabilizing the first reference signal, and comparing the first reference signal to a second reference signal. Wordlines intersecting the bitline are sequentially selected, and corresponding memory elements at the intersections of selected wordlines and the first bitline are interrogated after the first reference signal has stabilized and while the first sense current is applied to the first bitline.

In an MRAM device array comprising a plurality of bitlines and a plurality of wordlines, the wordlines intersecting the bitlines and each intersection of the wordlines and bitlines comprising a memory element, the bitlines arranged in bitline pairs and each bitline of the bitline pair provided as an input to a differential amplifier, a method for reading the memory elements of a corresponding bitline pair includes the steps of applying a first sense current to a first bitline in a bitline pair to generate a first reference signal to the differential amplifier, and applying a second sense current to a second bitline in the bitline pair to generate a second reference signal to the differential amplifier. The first and second reference signals are stabilized, and wordlines intersecting the first bitline are sequentially selected. Corresponding memory elements at the intersection of selected wordlines and the first bitline are interrogated while the first and second sense currents are applied to the first and second bitlines.

A method of accessing a memory block in an MRAM array comprising a plurality of bitlines and a plurality of wordlines, the wordlines intersecting the bitlines and each intersection of the wordlines and bitlines comprising a memory element, includes the steps of determining corresponding addressed wordlines and corresponding addressed bitlines of the memory block and sequentially selecting corresponding addressed bitlines in the memory block. For each corresponding addressed bitline sequentially selected, a bitline current is applied to the selected addressed bitline, and after the addressed bitline has reached a steady state condition in response to the application of the bitline current, corresponding addressed wordlines intersecting the sequentially selected addressed bitline are sequentially selected. An access operation on the memory element corresponding to the sequentially selected addressed bitline and the sequentially selected addressed wordline is then performed.

DETAILED DESCRIPTION

Figure 1:
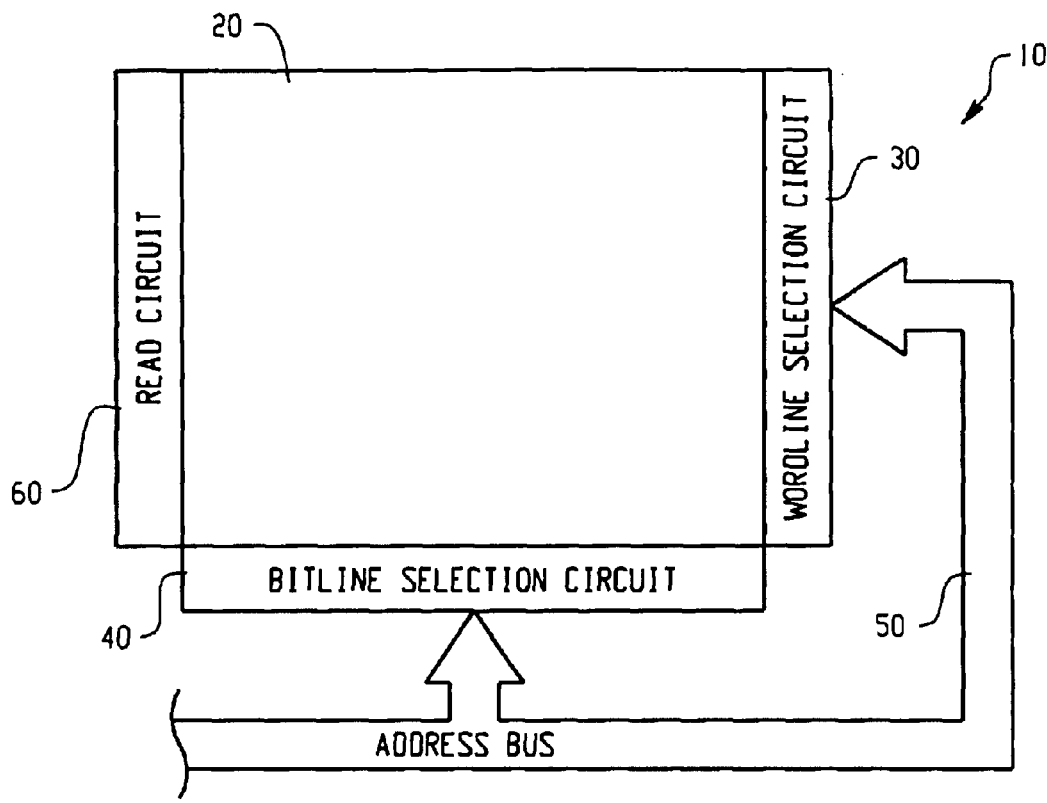
FIG. 1 is a block diagram of an MRAM device in which the systems and methods described herein may be implemented.

FIG. 1 is a block diagram of an MRAM device 10 in which the systems and methods described herein may be implemented. The MRAM device includes a memory array 20 that typically comprises a plurality of bitlines and a plurality of wordlines intersecting the bitlines. The wordlines may be selected by a wordline selection circuit 30, and the bitlines may be selected by a bitline selection circuit 40.

The intersection of each wordline and bitline comprises a magnetic memory element, such as a PSV cell. The wordline selection circuit 30 and the bitline selection circuit 40 may comprise decoders operable to select a wordline and bitline in response to a corresponding memory address input via an address bus 50. The wordline circuit 30 and the bitline circuit 40 may also comprise additional driver circuits, such as selectable current sources, for providing sense currents to selected wordlines and bitlines.

A read circuit 60 is operable to receive signals generated by the sense currents applied to the selected wordlines and bitlines and determine the data value of data stored in the corresponding memory elements. The read circuit 60 may comprise an array of sense amplifiers connected to the bitlines, or other known circuits configured to read the data value of data stored in the corresponding memory elements.

The MRAM device 10 of FIG. 1 can be utilized in a variety of applications, such as a random access memory (RAM) in an integrated circuit or computer, a Flash memory, a sub-array in a larger memory array, or other memory applications.

Figure 2:
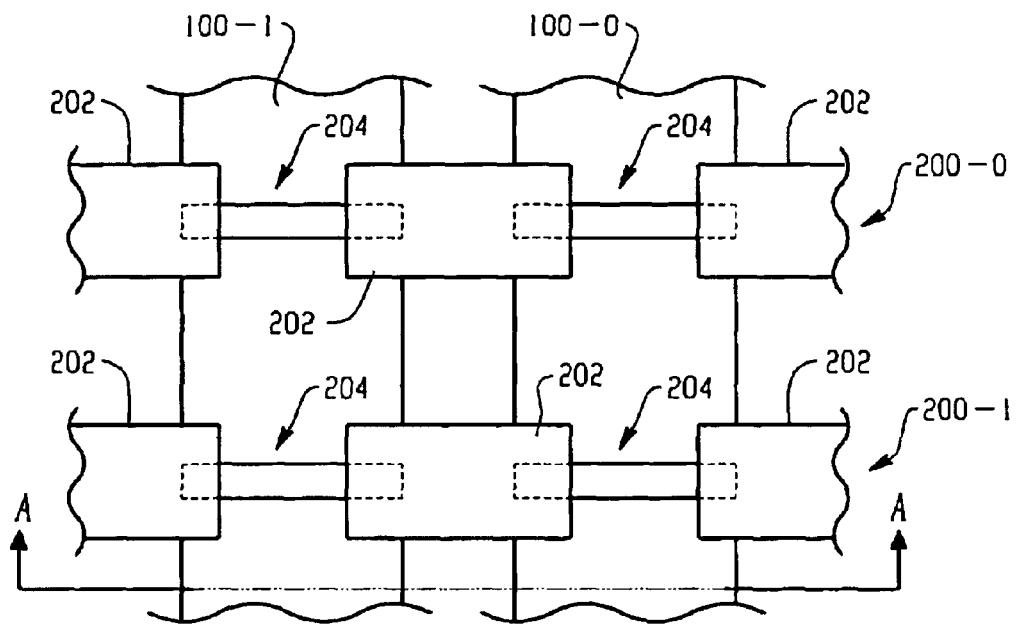
FIG. 2 is a top view of an intersection of several wordlines and several bitlines in the MRAM device.

FIG. 2 is a top view of an intersection of several wordlines 100-0, 100-1 and several bitlines 200-0, 200-1 in the MRAM device 10. Each bitline 200-0, 200-1 comprises conductor sections 202 coupled to memory elements 204 in an elongated manner to form a line of connected memory elements 204. The bitlines 200-0 and 200-1 are positioned in a parallel arrangement as shown in FIG. 2.

The wordlines 100-0 and 100-1 are illustratively arranged orthogonal to the bitlines 200-0 and 200-1 and intersect the bitlines 200-0 and 200-1 at the memory elements 204. To select a particular cell 204 in the memory array 20, a wordline 100 and a bitline 200 corresponding to the intersection of the particular cell 204 are selected.

Figure 3:
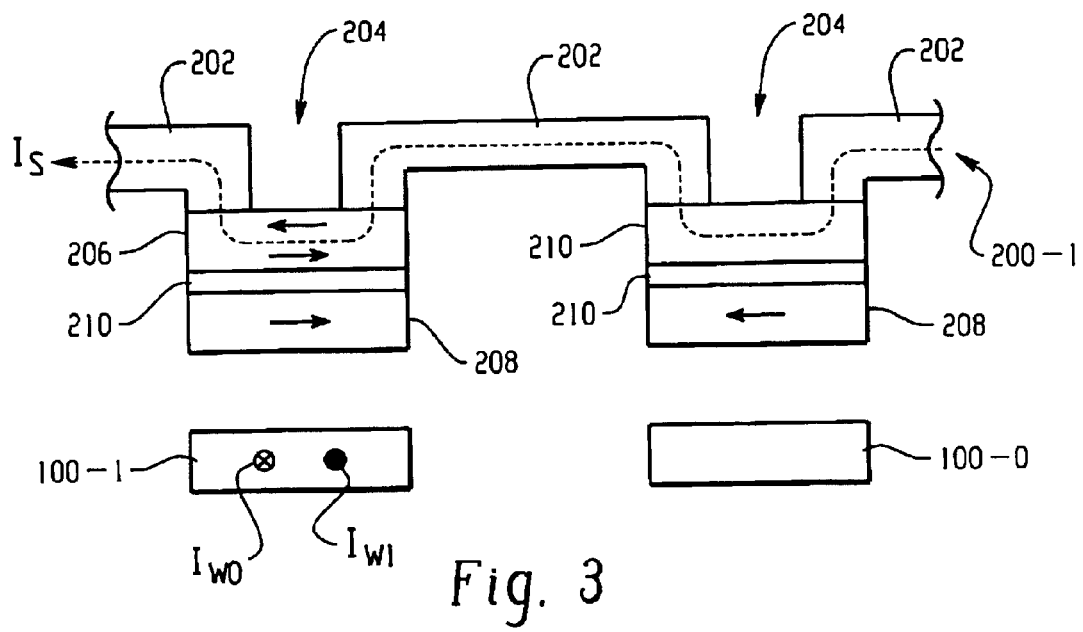
FIG. 3 is a front view of the intersection of the wordlines and the bitline in the MRAM device.

FIG. 3 is a front view of the intersection of the wordlines 100-0, 100-1 and the bitline 200-1 in the MRAM device 10. The memory element 204 illustratively comprises a PSV memory cell comprising a soft layer 206, a hard layer 208, and an interlayer 210 that separates the hard layer 208 from the soft layer 206. As shown, the hard layer 208 of the PSV cell 204 corresponding to the intersection of the word line 100-1 and the bitline 200-1 is magnetized to a first polarity, and the hard layer 208 of the PSV cell 204 corresponding to the intersection of the wordline 100-1 and the bitline 200-1 is magnetized to a second polarity.

To read the hard layer 208 of the PSV cell 204 corresponding to the intersection of the word line 100-1 and the bitline 200-1, a sense current is applied to the bitline 200-1. A first wordline current $I_{W0}$ is applied to the wordline 100-1, and the soft layer 206 is magnetically aligned to a first state. A second wordline current $I_{W1}$ is then applied to the wordline 100-1, and the soft layer 206 is then oppositely aligned to a second state.

Depending on polarization of the hard layer 208, the resistance of the PSV cell 204 will decrease or increase as the soft layer 204 switches alignment from the first state to the second state. For example, if the soft layer 206 is oppositely aligned with the hard layer 208 by the first wordline current $I_{W0}$, and then aligned with the hard layer 208 by the second wordline current $I_{W2}$, then the resistance of the PSV cell will decrease. Conversely, if the soft layer 206 is aligned with the hard layer 208 by the first wordline current $I_{W0}$, and then oppositely aligned with the hard layer 208 by the second wordline current $I_{W2}$, then the resistance of the PSV cell will increase. A corresponding voltage induced by the sense current $I_s$ is then monitored to determine whether the hard layer 208 is storing a data value of 0 or 1.

Figure 4:
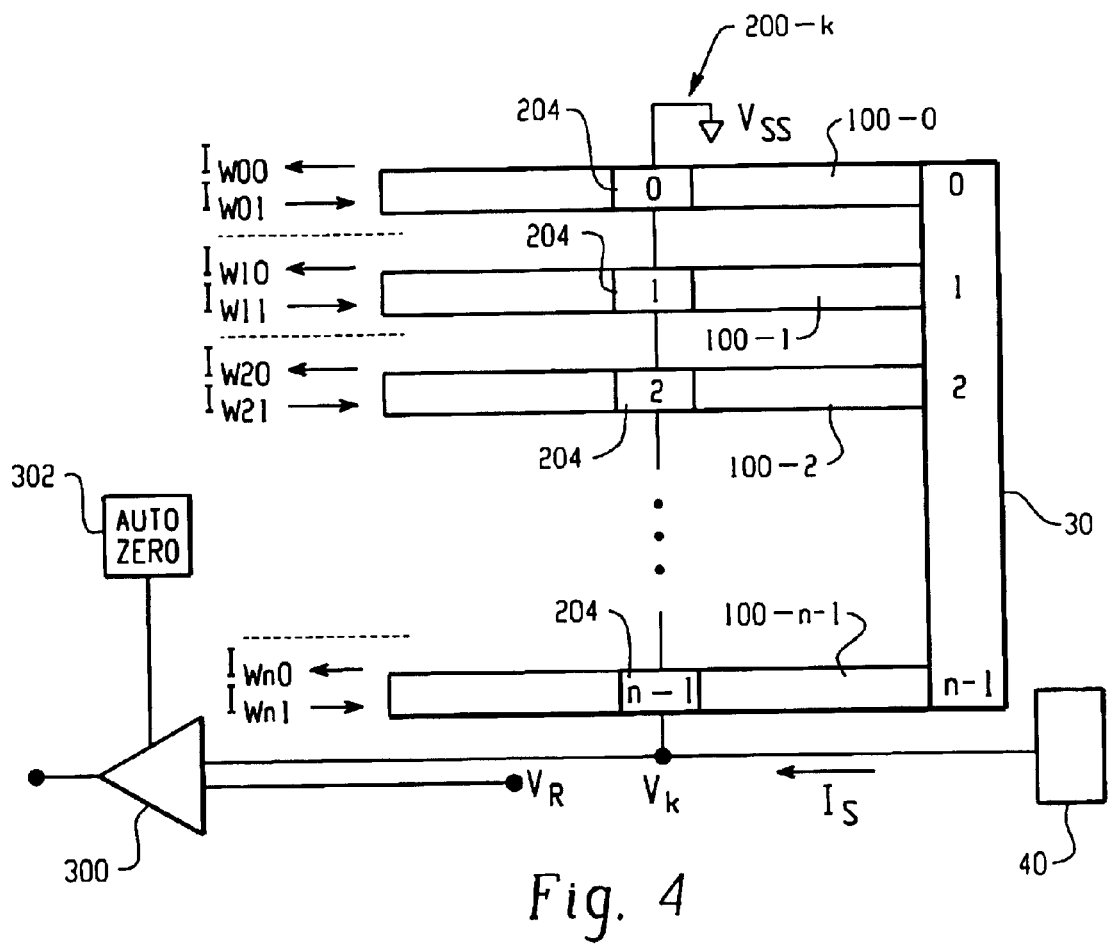
FIG. 4 is a schematic diagram of an embodiment of a system for accessing a memory array in the MRAM device.

FIG. 4 is a schematic view of an embodiment of a system for accessing a memory array in the MRAM device 10. The wordline selection circuit 30 is operable to select one of the wordlines 100-0, 100-1 . . . 100-n–1, and the bitline selection circuit 40 is operable to select one of the bitlines 200. To avoid congestion in the drawing, the bitline selection circuit 40 is depicted as having selected a bitline 200-k, and details for the other bitlines are omitted.

One end of the bitline 200-k is connected to a first input of a differential amplifier 300, and the other end of the bitline is connected to a potential $V_{SS}$, which is typically a ground potential. A second input of the differential amplifier 300 is connected to a voltage reference $V_R$. An auto-zero circuit 302 is connected to the differential amplifier 300 and is operable to zero the output of the differential amplifier for a given input. In another embodiment, the differential amplifier 300 may have the functionality of the auto-zero circuit 302, and thus the auto-zero circuit 302 may be eliminated.

The bitline selection circuit 40 includes a current driver to apply a sense current $I_s$ to the selected bitline 200-k. The current is induces a voltage $V_k$ at the first input of the differential amplifier 300. Typically, the bitline 200-k may be modeled as a string of series connected resistors with an inherent reactance. The inherent reactance may be caused by a line capacitance, a line inductance, or a combination of a line capacitance and a line inductance. Thus, a signal transient proportional to the natural response of the bitline 200-k is typically induced upon energization of the bitline 200-k. After the current $I_s$ is removed, a similar transient occurs as stored energy in the bitline 200-k is released.

During the occurrence of these transients, performance degradation of read operations may occur. The system of FIG. 4 helps reduce the number of transient states on a selected bitline 200-k by sequentially selecting wordlines 100-0, 100-1 . . . 100-n–1 after the bitline voltage $V_k$ has stabilized and during the application of the current $I_s$ to the bitline 200-k. The memory elements 204 in the bitline 200-k are interrogated during each sequential selection of the wordlines 100-0, 100-1 . . . 100-n–1. The bitline voltage $V_k$ is considered stabilized when the signal transient has reduced to a magnitude such that any further transient response will not adversely affect the output of the differential amplifier 300. For example, if the signal transient is a simple RC voltage response having a time constant of $\tau=RC$, then the signal may be considered stabilized after a time multiple of r has passed, for example, $2\tau$, $4\tau$, etc. Other methods of determining signal stabilization may also be used, however. Thus, the wordlines 100-0, 100-1 . . . 100-n–1 are selected and activated while the selected bitline 200-k is in a steady state condition.

Each wordline 100-0, 100-1 . . . 100-n–1 is sequentially selected by the wordline selection circuit 30 and the corresponding memory element 204 is interrogated until all of the memory elements 204 in the bitline 200-k, or all of the addressed memory elements 204 in the bitline 200-k, are interrogated. After all of the memory elements 204 in the bitline 200-k are interrogated, then the bitline 200-k is deselected, removing the sense current $I_s$, and another bitline 200 may then be selected for interrogation.

For example, if the bitline 200-k defines an n-bit word in memory, and the corresponding n-bit word is to be read, then the bitline 200-k is selected, and the sense current $I_s$ is is applied to the bitline 200-k, which induces a voltage $V_k$ at a first input of the differential amplifier 300. The wordline 100-0 is then selected, and after the voltage $V_k$ has stabilized, a first wordline current $I_{W00}$ is applied to the wordline 100-0, and the soft layer 206 of the corresponding memory element 204 is magnetically aligned to a first state. The differential amplifier 300 compares the voltage $V_k$ to the reference voltage $V_R$ and the output is zeroed. The output may be zeroed by known auto-zero techniques, such as by adjusting internal biases within the differential amplifier 300, or by adjusting the reference voltage $V_R$.

After the differential amplifier 300 has been zeroed, a second wordline current $I_{W01}$ is applied to the wordline 100-0, and the soft layer 206 is then oppositely aligned to a second state. Typically, the second wordline current $I_{W1}$ is the same magnitude as the first wordline current $I_{W0}$, but flows in the opposite direction. Depending on polarization of the hard layer 208, the resistance of the PSV cell 204 will decrease or increase as the soft layer 206 switches alignment from the first state to the second state. The resulting resistance change will likewise cause the magnitude of $V_k$ to change, thus changing the output voltage of the differential amplifier 300. The resulting output voltage change of the differential amplifier 300 is then interpreted as a data value of 1 or a data value of 0. For example, alignment of the soft layer 206 and the hard layer 208 may be interpreted as a data value of 1, and opposite alignment of the soft layer 206 and hard layer 208 may be interpreted as a data value of 0.

After the memory element 204 corresponding to the wordline 100-0 and bitline 200-k is read, then the wordline 100-0 is deselected, and the next wordline 100-1 is selected. First and second wordline currents $I_{W10}$ and $I_{W11}$ are applied to read the memory element 204 corresponding to the wordline 100-1 and the bitline 200-k. The wordline selection process and application of the wordline currents are then sequentially repeated for the remaining wordlines 100 intersecting the bitline 200-k. The bitline 200-k is deselected, and the next bitline 200 to be read is selected. The sense current $I_s$ is then applied to the next selected bitline 200.

In another example, if only a subset of the memory elements 204 of the bitline 200-k are to be interrogated, then the access method described above is limited to the subset of the memory elements 204.

Thus, by sequentially interrogating memory elements 204 in a selected bitline 200, only a single application of the sense current $I_s$ is required, and the energization and de-energization transient times associated with applying and removing the sense current $I_s$ to a selected bitline 200 are minimized. Accordingly, data access time to the memory array 20 is reduced.

Figure 5:
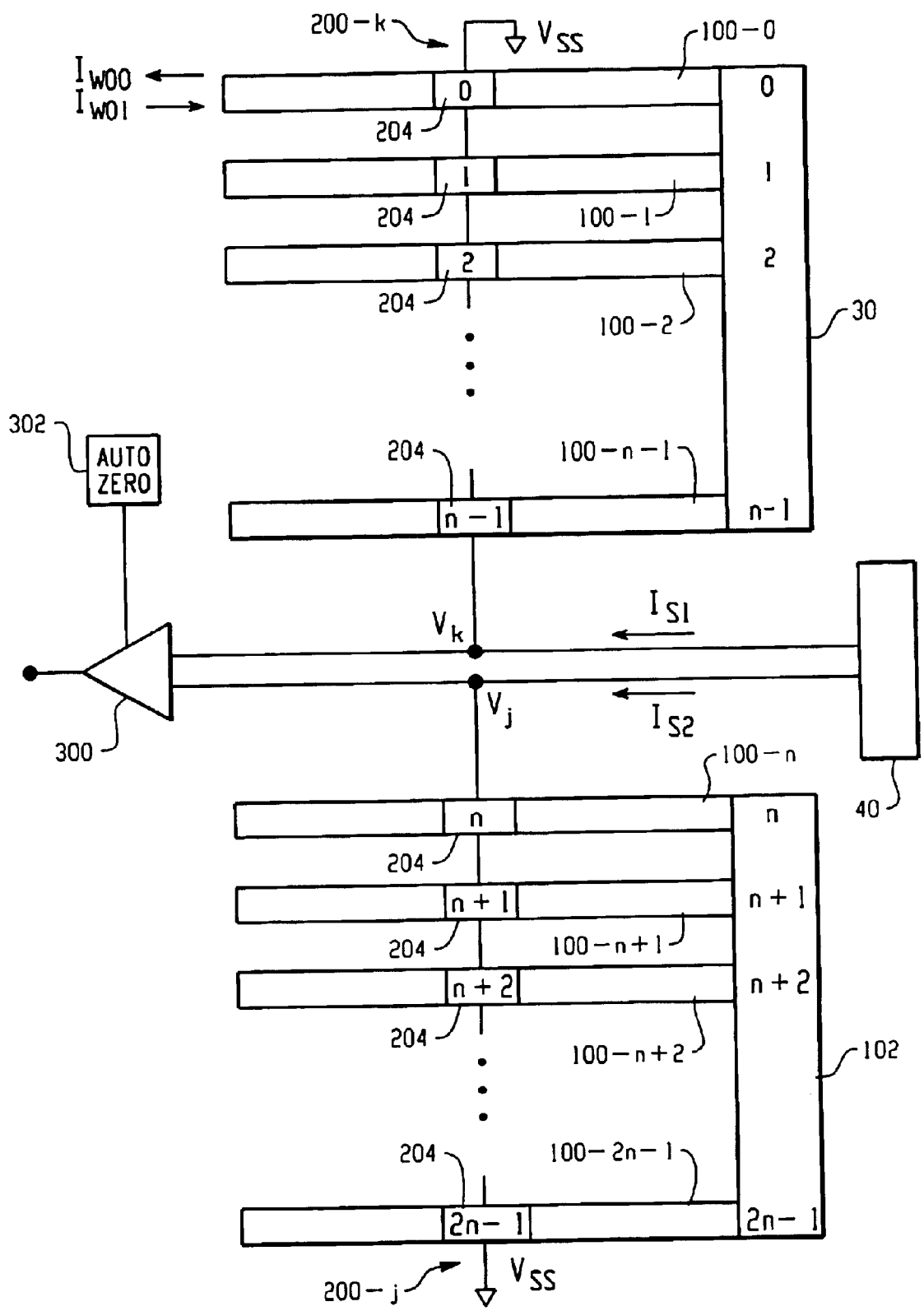
FIG. 5 is a schematic diagram of another embodiment of a system for accessing the memory array in the MRAM device.

FIG. 5 is a schematic view of another embodiment of a system for accessing the memory array in the MRAM device 10. In this embodiment, the bitlines 200 are arranged in bitline pairs. For example, the bitlines 200-k and 200-j define a bitline pair. The bitline pair may define a single word in the memory array 20, or may alternatively define two sequentially addressed words in the memory array 20.

In the embodiment of FIG. 5, each bitline 200-k and 200-j of the bitline pair is connected to an input of the differential amplifier 300. Upon selection of a bitline pair, a first sense current $I_{S1}$ is applied to the first bitline 200-k, and a second sense current $I_{S2}$ is applied to the second bitline 200-j. Reference voltages $V_k$ and $V_j$ are induced at the nodes defined by the bitlines 200-k and 200-j and the input terminals of the differential amplifier 300. A first wordline, such as wordline 100-0, is then selected, and after the voltages $V_k$ and $V_j$ have stabilized, first and second wordline current $I_{W00}$ and $I_{W01}$ are applied to read the memory element 204 corresponding to the intersection of the wordline 100-0 and the bitline 200-k. The read process may then be repeated for a subset of memory elements 204 of the bitlines 200-k and 200-j, or for all the memory elements 204 of the bitlines 200-k and 200-j, depending on the memory elements to be read.

The embodiment of FIG. 5 thus operates in a similar manner to the embodiment of FIG. 4, except that the reference voltage $V_R$ of FIG. 4 is replaced by the reference voltage $V_j$ induced on the complementary bitline 200-j, and the differential amplifier 300 is zeroed between the application of the first and second wordline currents by adjusting the internal biases of the differential amplifier 300.

As similarly described with respect to FIG. 4, the bitline voltages $V_j$ and $V_k$ are considered stabilized when the signal transients have reduced to a magnitude such that any further transient responses will not adversely affect the output of the differential amplifier 300. For example, if the signal transient $V_j$ is a simple RC voltage response having a time constant of $\tau_j R_j C_j$, and the signal transient $V_k$ is a simple RC voltage response having a time constant of $\tau_k = R_k C_k$, then the signals may be considered stabilized after time multiples of $\tau_j$ and $\tau_k$ have passed so that any further transient responses will not adversely affect the output of the differential amplifier 300. Other methods of determining signal stabilization may also be used, however.

The wordline selection circuit 30 may be configured to delay the sequential selection of the wordlines until after a time delay proportional to the natural response of the energization of a bitline has expired. Alternatively, the address of the corresponding wordline and bitline may be input to the address bus 50 in the sequential manner described above after a time delay proportional to the natural response of the energization of a bitline has expired. In this latter case, an I/O controller or a microprocessor may be configured to determine when the time delay proportional to the natural response of the energization of the bitline has expired, and then input the addresses to be read into the address bus in the sequential manner described.

Figure 6:
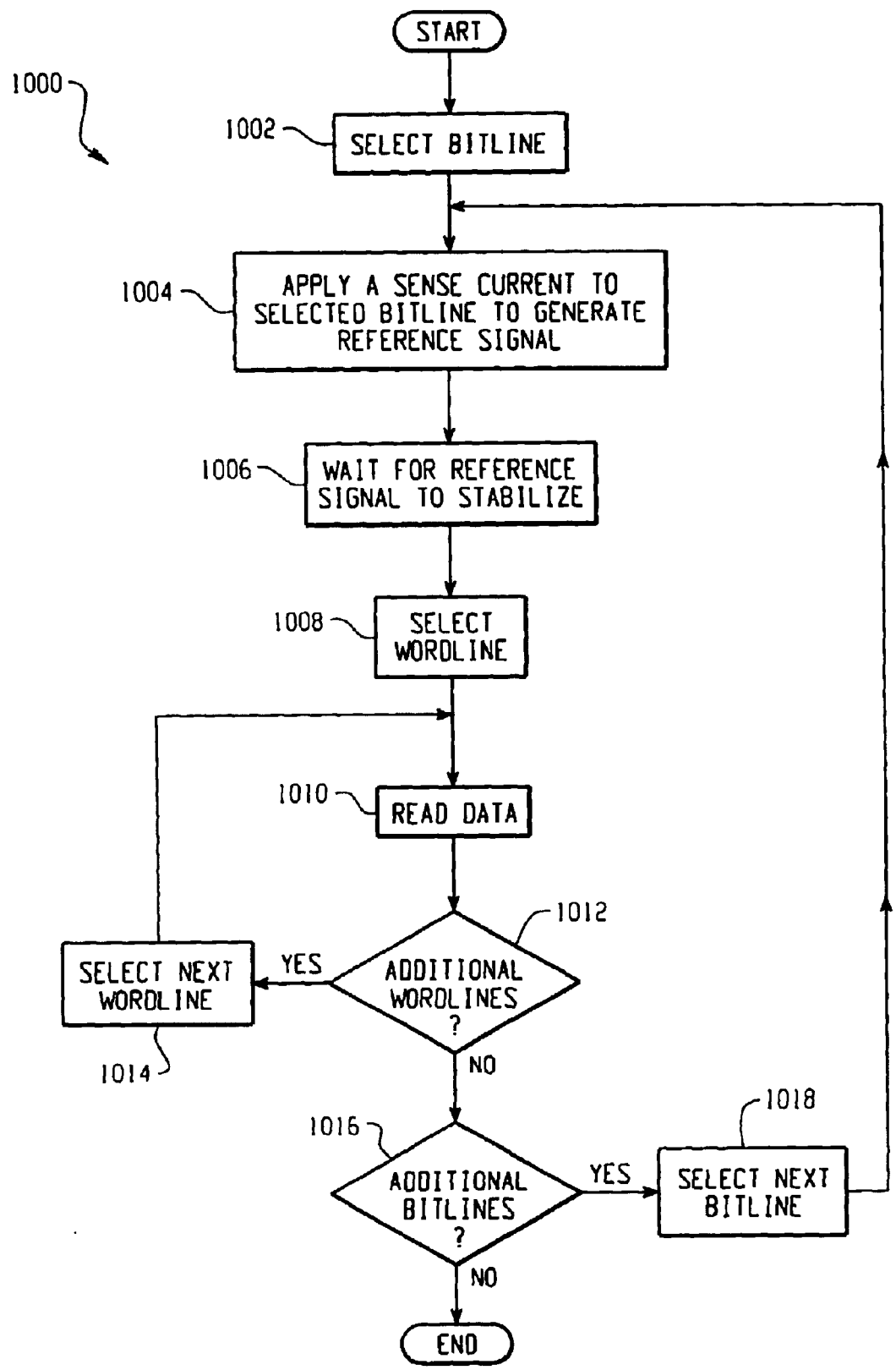
FIG. 6 is a flow diagram of a method for accessing a memory array in an MRAM device.

Other methods to implement the sequential addressing and timing described above may also be used. FIG. 6 is a flow diagram 1000 of one such method for accessing a memory array in an MRAM device. The method according to the flow diagram 1000 may be implemented in the embodiment of FIG. 4, or other MRAM memory arrays having a single bitline configuration.

Typically, the method may be invoked when a memory block in an MRAM memory array is to be read. The memory block may be defined by an address block that corresponds to a plurality of wordlines and bitlines. The memory block is accessed by sequentially selecting corresponding bitlines in the memory block, and for each corresponding bitline selected, corresponding wordlines in the memory block are then selected, and the memory elements are interrogated. The memory block may comprise a single word or subset of a word, a block of words, or even separate blocks of words.

In step 1002, a bitline is selected. After the bitline is selected, a sense current is applied to the bitline to generate a reference signal, as shown in step 1004. An addressing circuit, such as a decoder operable to receive an address over an address bus, may be used to select the bitline, and a bitline driver, such as a current source, may be used to apply the current to the selected bitline. Alternatively, a bitline selection circuit that is operable to both select the bitline and apply the sense current may be used.

Step 1006 waits for the first reference signal to stabilize, and step 1008 selects a wordline corresponding to a memory element in the selected bitline that is to be read. Steps 1004, 1006 and 1008 may be performed simultaneously, or sequentially as shown. The time delay of step 1006 may be proportional to the natural response of the bitline. In one embodiment, the time delay may be a fixed delay implemented in a wordline selection circuit that occurs whenever a bitline is selected. In another embodiment, the time delay is implemented by delaying sequential addressing of the wordlines over an address bus.

Once the reference signal has stabilized, the data stored in the memory element corresponding to the selected wordline and selected bitline is read, as shown in step 1010. The data may be read by using a differential amplifier to compare the change in the first reference signal relative to a second reference signal, as described with reference to FIG. 4. Alternatively, the data may be read by monitoring the change of the first reference signal only. Other read techniques may also be used.

After the memory element has been read, step 1012 determines if there are additional wordlines that intersect the selected bitline to be selected. This determination is made based upon the memory addresses to be read. All of the memory elements of the selected bitline, or a subset of the memory elements of the selected bitline, may be selected to be read. If an additional wordline is to be selected, then in step 1014 the additional wordline is selected and steps 1010 and 1012 are repeated.

If no additional wordlines are to be read, then step 1016 determines if additional bitlines are to be selected. This determination is made based upon the memory addresses to be read. If additional bitlines are to be selected, then step 1018 selects the next bitline, and steps 1004, 1006, 1008, 1010, 1012, and 1016 are repeated. If no additional bitlines are to be selected, then the memory access is complete.

Figure 7:
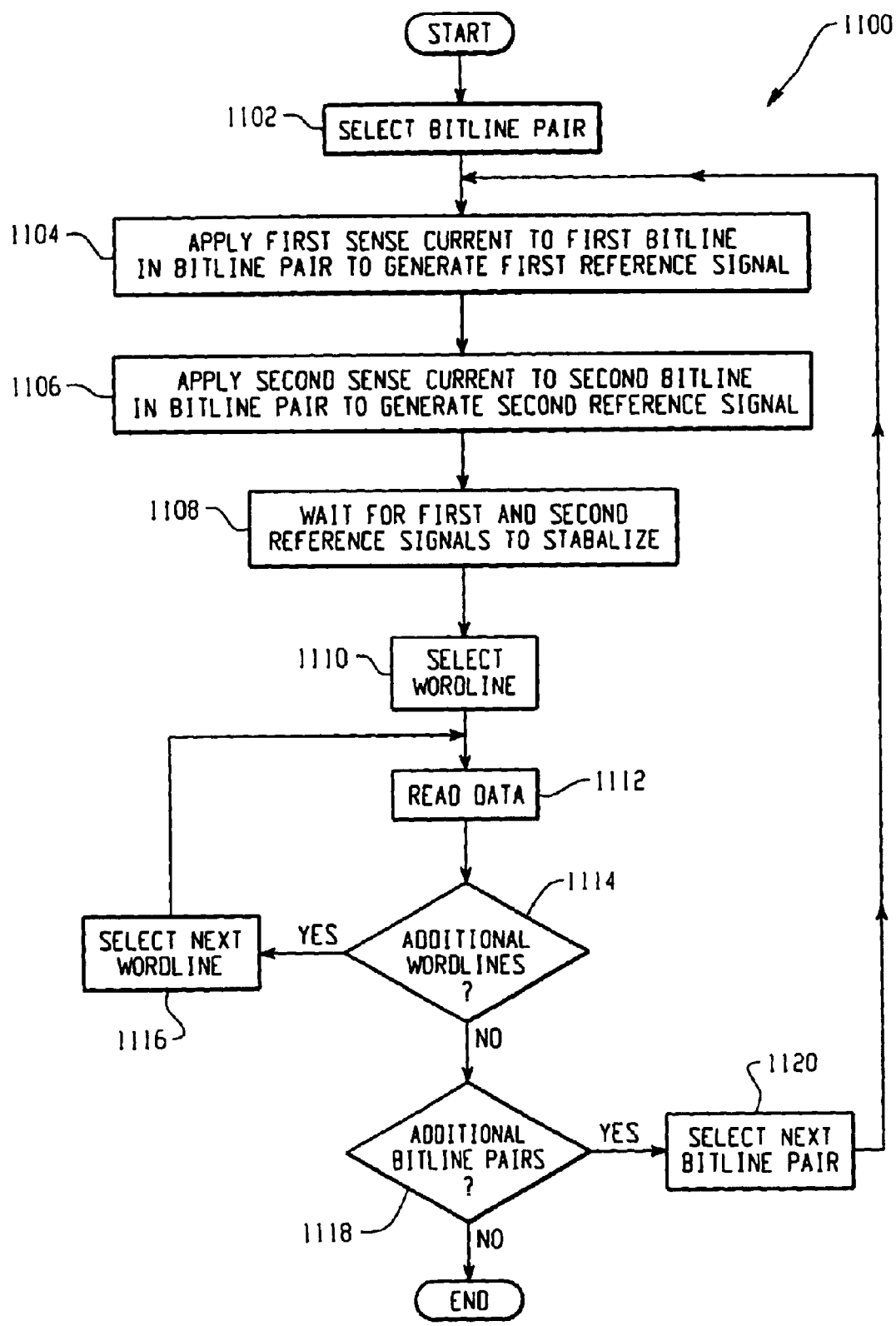
FIG. 7 is a flow diagram of another method for accessing a memory array in an MRAM device.

FIG. 7 is a flow diagram 1100 of another method for accessing a memory array in an MRAM device. The method according to the flow diagram 1100 may be implemented in the embodiment of FIG. 5, or other MRAM memory arrays having a paired bitline configuration.

In step 1102, a bitline pair is selected. After the bitline pair is selected, a first sense current is applied to a first bitline of the bitline pair to generate a first reference signal, as shown in step 1104. A second sense current is applied to a second bitline of the bitline pair to generate a second reference signal, as shown in step 1106. An addressing circuit, such as a decoder operable to receive an address over an address bus, may be used to select the bitline pair, and a bitline driver, such as a current source, may be used to apply the current to the selected bitlines. Alternatively, a bitline selection circuit that is operable to both select the bitlines and apply the sense currents may be used.

Step 1108 waits for the first and second reference signal to stabilize, and step 1110 selects a wordline corresponding to a memory element in the selected bitline pair that is to be read. Steps 1104, 1106, 1108 and 1110 may be performed simultaneously, or sequentially as shown. The time delay of step 1108 may be proportional to the natural response of the bitlines. In one embodiment, the time delay may be a fixed delay implemented in a wordline selection circuit that occurs whenever a bitline pair is selected. In another embodiment, the time delay is implemented by delaying sequential addressing of the wordlines over an address bus.

Once the reference signals have stabilized, the data stored in the memory element corresponding to the selected wordline and selected bitline is read, as shown in step 1112. The data may be read by using a differential amplifier to compare the change in the first reference signal relative to the second reference signal, as described with reference to FIG. 5. Alternatively, the data may be read by monitoring the change of the first reference signal only. Other read techniques may also be used.

After the memory element has been read, step 1114 determines if there are additional wordlines that intersect the selected bitlines to be selected. This determination is made based upon the memory addresses to be read. All of the memory elements of the selected bitline, or a subset of the memory elements of the selected bitline, may be selected to be read. If an additional wordline is to be selected, then in step 1016 the additional wordline is selected and steps 1112 and 1114 are repeated.

If no additional wordlines are to be read, then step 1118 determines if additional bitlines are to be selected. This determination is made based upon the memory addresses to be read. If additional bitlines are to be selected, then step 1120 selects the next bitline, and steps 1104, 1106, 1108, 1110, 1112, 1114, 1116 and 1118 are repeated. If no additional bitlines are to be selected, then the memory access is complete.

Figure 8:
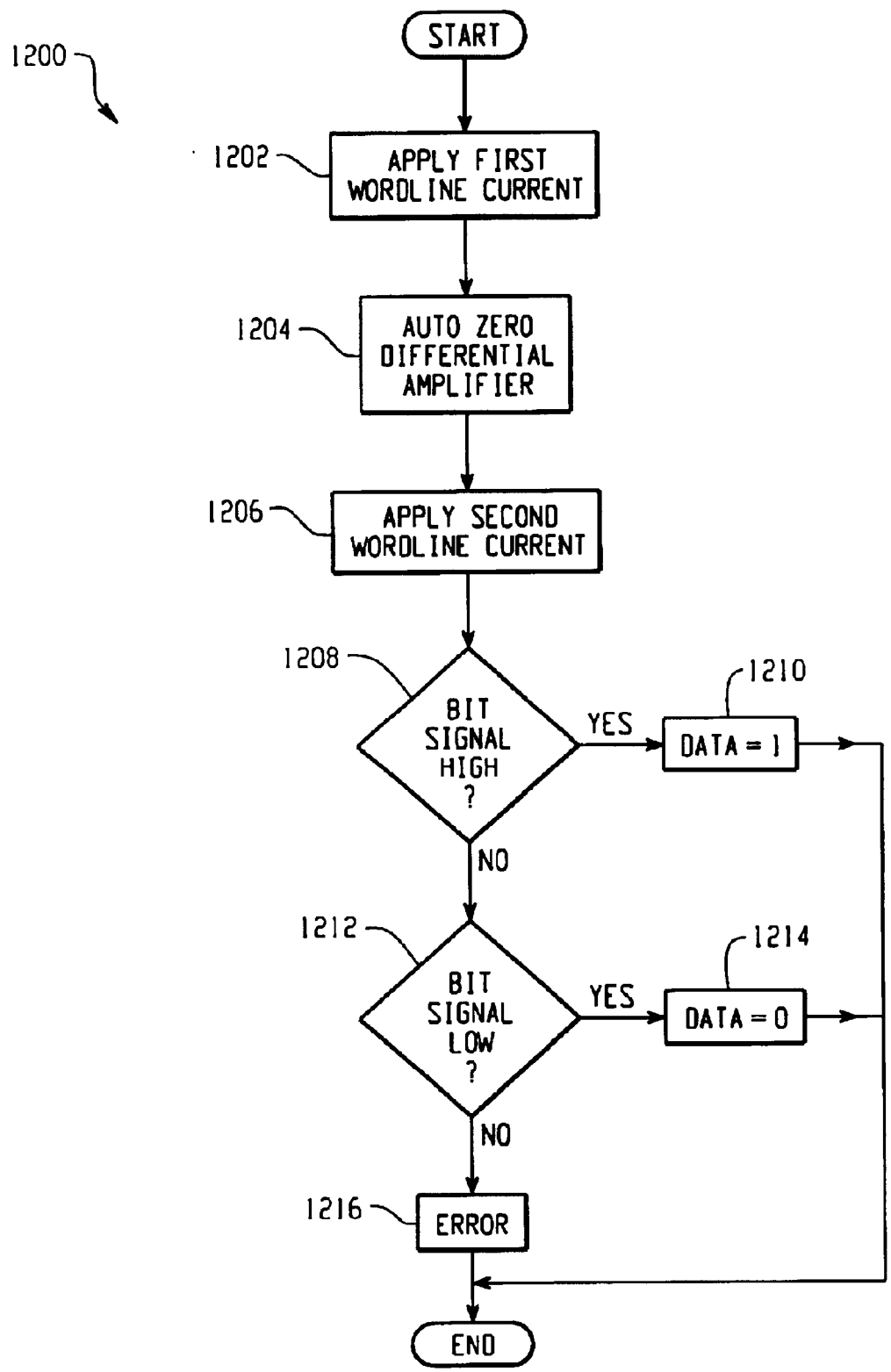
FIG. 8 is a flow diagram of a method for reading a memory element in a memory array in an MRAM device.

FIG. 8 is a flow diagram 1200 of a method for reading a memory element in a memory array in an MRAM device. The method of FIG. 8 may be used during the execution of step 1010 of FIG. 6 or during the execution of step 1112 of FIG. 7. In step 1202, a first wordline current is applied to a selected wordline. The first wordline current magnetically aligns a soft layer of a memory element to a first state. In step 1204, the output of a differential amplifier receiving the first reference signal is zeroed. In step 1206, a second wordline current is applied to the selected wordline. The second wordline current magnetically aligns the soft layer of the memory element to a second state. Depending on the magnetic alignment of a hard layer in the memory element, the differential amplifier will output a high bit signal or a low bit signal in response to the alignment of the soft layer to the second state.

Step 1208 determines if the differential amplifier outputs a high bit signal. If the differential amplifier outputs a high bit signal, then in step 1210 a data value is set to 1. If the differential amplifier does not output a high bit signal, then step 1212 determines if the differential amplifier outputs a low bit signal. If the differential amplifier outputs a low bit signal, then in step 1214 a data value is set to 0. If the differential amplifier does not output a low bit signal, then step 1216 signals that an error condition has occurred.

Figure 9:
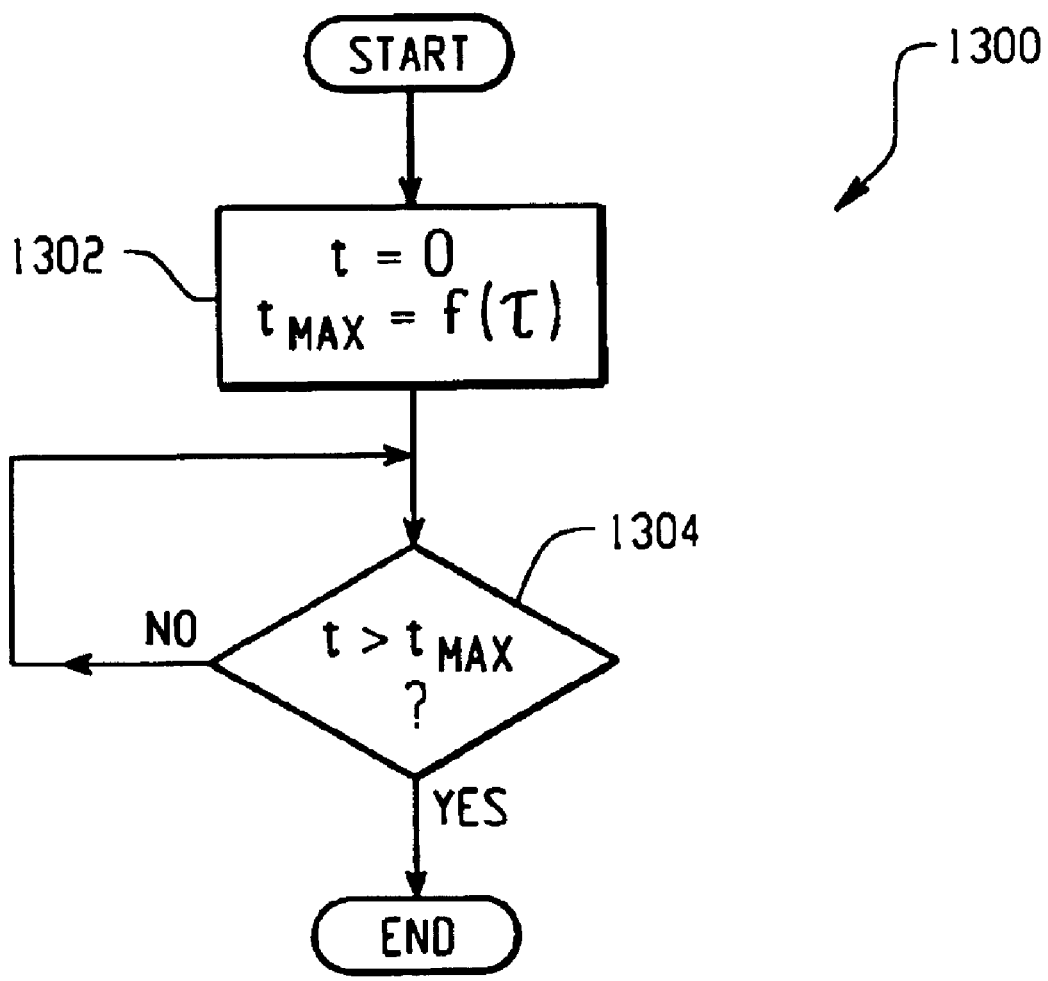
FIG. 9 is a flow diagram of a method for determining whether a time delay proportional to a natural response of a signal has expired.

FIG. 9 is a flow diagram of a method for determining whether a time delay proportional to a natural response of a signal has expired. The signal may be associated with a voltage reference signal generated on a bitline when a sense current is applied to the bit line. The bitline may have a characteristic complex impedance, and thus have a natural transient response. For example, if the transient response is a first order response, such as a characteristic response of an inductive or capacitive line, the transient response is proportional to a time constant $\tau$, where $\tau=L/R$ or RC. In step 1302, a loop time t is initialized to a 0 value, and a time delay $\tau_{max}$ is initialized to a value proportional to $f(\tau)$. The function $f(\tau)$ is based on the time constant $\tau$. For example, for a natural RC response, $f(\tau)$ may be set to a multiple of $\tau$, e.g., $3\tau$.

After step 1302 is executed, the system is in a wait state. Step 1304 determines if the loop time exceeds the time delay $t_{max}$. If the loop time exceeds the time delay $t_{max}$, then the signal generated by the sense current applied to the bitline has stabilized, and the system exits the wait state. If the loop time does not exceed the time delay $t_{max}$, then the signal generated by the sense current applied to the bitline has not stabilized, and the system remains in the wait state.

The wordline selection circuit may be configured execute the method of FIG. 9 to delay the sequential selection of the wordlines until after a time delay proportional to the natural response of the energization of a bitline has expired. Alternatively, an I/O controller or a microprocessor may be configured to execute the method of FIG. 9 to determine when the time delay proportional to the natural response of the energization of the bitline has expired, and then input the wordline addresses to be read into the address bus in the sequential manner described.

Other methods of delaying the sequential selection of the wordlines may also be implemented. For example, the wordline selection circuitry may be operable to monitor the bitline reference voltage at the input of the differential amplifier and enable sequential selection of the wordlines after the bitline reference voltage reaches a predetermined voltage value that indicates the bitline has reached a steady state condition.

The systems and methods disclosed herein thus provide for decreased access time to an MRAM memory array. Of course, variations of the embodiments described herein exist. For example, while the systems and methods have been described with reference to reading memory elements of an MRAM memory array, the systems and methods may also be implemented for writing to the memory elements of the MRAM memory array by configuring the wordline selection circuit to apply write currents to selected wordlines after transients on the bitline have stabilized.

Finally, this written description uses illustrative embodiments to disclose the invention, including the best mode, and also to enable a person of ordinary skill in the art to make and use the invention. Other devices and methods are within the scope of the claims if they have elements that do not differ from the literal language of the claims, or if they have equivalent elements.

What is claimed is:

1. In a magnetoresistive random access memory (MRAM) device array comprising a plurality of bitlines and a plurality of wordlines, the wordlines intersecting the bitlines and each intersection of the wordlines and bitlines comprising a memory element, the bitlines arranged in bitline pairs and each bitline of the bitline pair provided as an input to a differential amplifier, a method for reading the memory elements of a corresponding bitline pair, the method comprising the steps of:

applying a first sense current to a first bitline in a bitline pair to generate a first reference signal for the differential amplifier;

applying a second sense current to a second bitline in the bitline pair to generate a second reference signal for the differential amplifier;

stabilizing the first and second reference signals; and sequentially selecting wordlines intersecting the first bitline and interrogating corresponding memory elements at the intersection of selected wordlines and the first bitline after the first and second reference signals have stabilized and while the first and second sense currents are applied to the first and second bitlines.

2. The method of claim 1, wherein the step of sequentially selecting wordlines intersecting the first bitline and interrogating corresponding memory elements at the intersection of selected wordlines and the first bitline comprises the steps of:

selecting a first wordline intersecting the first bitline;
  applying a third sense current to the first word line;
  zeroing the output of the differential amplifier;
  applying a fourth sense current to the first word line;
  measuring an output change in the differential amplifier;
  determining a data value stored in a memory element corresponding to the first wordline and first bitline based on the measured output change in the differential amplifier;
  selecting a second wordline intersecting the first bitline;
  applying the third sense current to the second word line;
  zeroing the output of the differential amplifier;
  applying the fourth sense current to the second word line;
  measuring an output change in the differential amplifier; and
  determining a data value stored in a memory element corresponding to the second wordline and first bitline based on the measured output change in the differential amplifier.

3. The method of claim 2, wherein the fourth sense current is negative with reference to the third sense current.

4. The method of claim 3, wherein the MRAM device is a pseudo spin valve (PSV) device.

5. The method of claim 4, wherein the step of stabilizing the first and second reference signals comprises the step of sequentially selecting the wordlines after a time delay proportional to the natural response of the bitline pairs.

6. The method of claim 1, further comprising the step of sequentially selecting wordlines intersecting the second bitline and interrogating corresponding memory elements at the intersection of selected wordlines and the second bitline after the first and second reference signals have stabilized and while the first and second sense currents are applied to the first and second bitlines.

7. The method of claim 1, wherein the step of sequentially selecting wordlines intersecting the first bitline and interrogating corresponding memory elements at the intersection of selected wordlines and the first bitline comprises the steps of:

applying a positive current to the selected wordline;
  applying a negative current to the selected wordline;
  measuring an output change in the output of the differential amplifier; and
  determining a data value stored in a memory element corresponding to the selected wordline and the first bitline based on the output change in the output of the differential amplifier.

8. The method of claim 7, further comprising the step of zeroing the output of the differential amplifier between the application of the positive current and the negative current to establish a reference signal to determine the data value stored in the memory element corresponding to the selected wordline and the first bitline.

9. The method of claim 7, wherein the MRAM device is a pseudo spin valve (PSV) device.

10. The method of claim 9, wherein the step of stabilizing the first and second reference signals comprises the step of sequentially selecting the wordlines after a time delay proportional to the natural response of the bitline pairs.

11. In a magnetoresistive random access memory (MRAM) device array comprising a plurality of bitlines and a plurality of wordlines, the wordlines intersecting the bitlines and each intersection of the wordlines and bitlines comprising a memory element, a method for reading the memory elements comprising the steps of:
applying a first sense current to a first bitline to generate a first reference signal;
stabilizing the first reference signal;
comparing the first reference signal to a second reference signal; and
sequentially selecting wordlines intersecting the first bitline and interrogating corresponding memory elements at the intersections of selected wordlines and the first bitline after the first reference signal has stabilized and while the first sense current is applied to the first bitline.

12. The method of claim 11, wherein the step of sequentially selecting wordlines intersecting the first bitline and interrogating corresponding memory elements at the intersections of selected wordlines and the first bitline comprises the steps of:
providing the first reference signal and the second reference signal as first and second inputs to a differential amplifier;
selecting a first wordline intersecting the first bitline;
applying a second sense current to the first word line;
zeroing the output of the differential amplifier;
applying a third sense current to the first word line;
measuring an output change in the differential amplifier,
determining a data value stored in a memory element corresponding to the first wordline and first bitline based on the measured output change in the differential amplifier,
selecting a second wordline intersecting the first bitline;
applying the second sense current to the second word line;
zeroing the output of the differential amplifier;
applying the third sense current to the second word line;
measuring an output change in the differential amplifier; and
determining a data value stored in a memory element corresponding to the second wordline and first bitline based on the measured output change in the differential amplifier.

13. The method of claim 12, wherein the third sense current is negative with respect to the second sense current.

14. The method of claim 13, wherein the MRAM device is a pseudo spin valve (PSV) device.

15. The method of claim 14, wherein the step of stabilizing the first reference signal comprises the step of sequentially selecting the wordlines after a time delay proportional to the natural response of the first bitline.

16. The method of claim 15, wherein the step of comparing the first reference signal to a second reference signal comprises the steps of:
applying a second sense current to a second bitline to generate the second reference signal;
stabilizing the second reference signal; and
providing the first reference signal and the second reference signal as first and second inputs to a differential amplifier.

17. The method of claim 11, wherein the step of sequentially selecting wordlines intersecting the bitline and interrogating corresponding memory elements at the intersections of selected wordlines and the first bitline comprises the steps of:
providing the first reference signal and the second reference signal as first and second inputs to a differential amplifier;
applying a positive current to a selected wordline;
applying a negative current to the selected wordline;
measuring an output change in the output of the differential amplifier; and
determining a data value stored in a memory element corresponding to the selected wordline and the first bitline based on the output change in the output of the differential amplifier.

18. The method of claim 17, further comprising the step of zeroing the output of the differential amplifier between the application of the positive current and the negative current to establish a reference signal to determine the data value stored in the memory element corresponding to the selected wordline and the first bitline.

19. The method of claim 18, wherein the MRAM device is a pseudo spin valve (PSV) device.

20. A system for accessing a magnetoresistive random access memory (MRAM) device array, comprising:
means for applying a first sense current to a first bitline in a bitline pair to generate a first reference signal;
means for applying a second sense current to a second bitline in the bitline pair to generate a second reference signal; and
means for sequentially selecting wordlines intersecting the first bitline after the first and second reference signals have stabilized and while the first and second sense currents are applied to the first and second bitlines.

21. The system of claim 20, further comprising:
means for comparing the first reference signal to the second reference signal; and
means for determining a data value stored in a memory element corresponding to the selected wordline and first bitline based on the comparison of the first and second reference signals.

22. The system of claim 21, wherein the means for sequentially selecting wordlines intersecting the first bitline after the first and second reference signals have stabilized and while the first and second sense currents are applied to the first and second bitlines further comprises means for applying a positive current to a selected word line and for applying a negative current to the selected word line.

23. The system of claim 22, further comprising means for zeroing the means for comparing between the application of the positive current and the negative current.

24. The system of claim 20, wherein the means for sequentially selecting wordlines is adapted to delay selection of the wordlines for a time delay proportional to the natural response of the first and second bitlines.

25. The system of claim 20, wherein the means for sequentially selecting wordlines intersecting the first bitline after the first and second reference signals have stabilized and while the first and second sense currents are applied to the first and second bitlines further comprises means for applying a write current to a selected word line for writing data to the MRAM device array.

26. A system for accessing a magnetoresistive random access memory (MRAM) device array, comprising:

means for applying a first sense current to a first bitline to generate a first reference signal;

means for sequentially selecting wordlines intersecting the first bitline after the first reference signal has stabilized and while the first sense current is applied to the first bitline; and means for accessing corresponding memory elements at the intersections of the selected wordline and the first bitline.

27. The system of claim 26, wherein the means for accessing comprises:

means for generating a second reference signal;

means for comparing the first reference signal to the second reference signal.

28. The system of claim 27, wherein the means for generating a second reference signal comprises:

a second bitline; and means for applying a second sense current to the second bitline to generate the second reference signal;

wherein the means for sequentially selecting wordlines intersecting the first bitline is further adapted for sequentially selecting wordlines after the second reference signal has stabilized and while the second sense current is applied to the second bitline.

29. The system of claim 28, wherein the means for accessing further comprises means for applying a positive current to a selected word line and for applying a negative current to the selected word line.

30. The system of claim 29, further comprising means for zeroing the means for comparing between the application of the positive current and the negative current.

31. The system of claim 30, wherein the means for sequentially selecting wordlines is adapted to delay selection of the wordlines for a time delay proportional to the natural response of the first and second bitlines.

32. The system of claim 26, wherein the means for sequentially selecting wordlines is adapted to delay selection of the wordlines for a time delay proportional to the natural response of the first bitline.

33. The system of claim 26, wherein the means for accessing comprises means for applying a write current to a selected wordline for writing data to the MRAM device array.

34. A magnetoresistive random access memory (MRAM) device, comprising:

a memory array comprising a plurality of bitlines and a plurality of wordlines intersecting the bitlines;

a plurality of memory elements, each memory element located at an intersection of a wordline and a bitline and operable to store data;

a bitline selection circuit operable to select a first bitline and to provide a first sense current to the first bitline to generate a first reference signal;

a wordline selection circuit operable to select wordlines and to provide wordline currents to a selected wordline after the first reference signal has stabilized and while the first sense current is applied to the first bitline.

35. The MRAM device of claim 34, further comprising a differential amplifier coupled to the first bitline and operable to compare the first reference signal to a second reference signal and produce a bit output signal corresponding to a data value stored in the memory element corresponding to the selected wordline and the first bit line.

36. The MRAM device of claim 35, wherein the memory elements comprise pseudo spin valve (PSV) memory elements.

37. The MRAM device of claim 36, wherein the wordline currents comprise a positive current and a negative current.

38. The MRAM device of claim 37, further comprising an auto-zeroing circuit connected to the differential amplifier and operable to zero the output of the differential amplifier between the application of the positive current and the negative current.

39. The MRAM device of claim 38, wherein the plurality of bitlines are arranged in bitline pairs, and the bitline selection circuit is further operable to select a second bitline and to provide a second sense current to the second bitline to generate the second reference signal.

40. The MRAM device of claim 39, wherein the first and second bitline comprise a bitline pair.

41. The MRAM device of claim 39, wherein the wordline selection circuit is further operable to provide the wordline currents to the selected wordline after the second reference signal has stabilized and while the second sense current is applied to the second bitline.

42. The MRAM device of claim 35, wherein the plurality of bitlines are arranged in bitline pairs, and the bitline selection circuit is further operable to select a second bitline and to provide a second sense current to the second bitline to generate the second reference signal.

43. The MRAM device of claim 42, wherein the first and second bitline comprise a bitline pair, and the wordline selection circuit is further operable to provide the wordline currents to the selected wordline after the second reference signal has stabilized and while the second sense current is applied to the second bitline.

44. The MRAM device of claim 43, wherein the memory elements comprise pseudo spin valve (PSV) memory elements, and the wordline currents comprise a positive current and a negative current.

45. The MRAM device of claim 44, further comprising an auto-zeroing circuit connected to the differential amplifier and operable to zero the output of the differential amplifier between the application of the positive current and the negative current.

46. The MRAM device of claim 34, wherein the wordline selection circuit is adapted to select the wordlines after the first reference signal has stabilized by delaying selection of the wordlines for a time delay proportional to the natural response of the wordlines.

47. A method of accessing a memory block in a magnetoresistive random access memory (MRAM) array comprising a plurality of bitlines and a plurality of wordlines, the wordlines intersecting the bitlines and each intersection of the wordlines and bitlines comprising a memory element, the method comprising the steps of:

determining corresponding addressed wordlines and corresponding addressed bitlines of the memory block;

sequentially selecting corresponding addressed bitlines in the memory block; and for each corresponding addressed bitline sequentially selected:

applying a bitline current to the selected addressed bitline; and after the addressed bitline has reached a steady state condition in response to the applied bitline current, sequentially selecting corresponding addressed wordlines intersecting the sequentially selected addressed bitline and performing an access operation on the memory element corresponding to the sequentially selected addressed bitline and the sequentially selected addressed wordline.

48. The method of claim 47, wherein access operation is a read operation.

49. The method of claim 47, wherein the access operation is a write operation.

* * * * *